(12) United States Patent
Roelofs et al.

(10) Patent No.: US 8,227,783 B2
(45) Date of Patent: Jul. 24, 2012

(54) NON-VOLATILE RESISTIVE SENSE MEMORY WITH PRASEODYMIUM CALCIUM MANGANESE OXIDE

(75) Inventors: Andreas Roelofs, Eden Prairie, MN (US); Markus Siegert, Minneapolis, MN (US); Venugopalan Vaithyanathan, Bloomington, MN (US); Wei Tian, Bloomington, MN (US); Yongchul Ahn, Eagan, MN (US); Muralikrishnan Balakrishnan, Eden Prairie, MN (US); Olle Heinonen, Eden Prairie, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 246 days.

(21) Appl. No.: 12/501,533

(22) Filed: Jul. 13, 2009

(65) Prior Publication Data

US 2011/0006275 A1    Jan. 13, 2011

(51) Int. Cl.
    *H01L 29/02*    (2006.01)
(52) U.S. Cl. ............................. 257/2; 438/104
(58) Field of Classification Search ...... 257/2; 438/104, 438/482
    See application file for complete search history.

(56) References Cited

U.S. PATENT DOCUMENTS

| | | | |
|---|---|---|---|
| 6,031,287 A * | 2/2000 | Harshfield | ..................... 257/734 |
| 6,774,054 B1 | 8/2004 | Zhang | |
| 6,911,361 B2 | 6/2005 | Zhang | |
| 6,930,342 B2 * | 8/2005 | Kito | ............................... 257/296 |
| 6,939,724 B2 | 9/2005 | Zhuang | |
| 6,955,992 B2 | 10/2005 | Zhang | |
| 7,521,705 B2 * | 4/2009 | Liu | ..................................... 257/2 |
| 7,910,427 B1 * | 3/2011 | Ikeda et al. | .................. 438/238 |
| 7,927,961 B2 * | 4/2011 | Park | .............................. 438/404 |
| 2004/0235247 A1 * | 11/2004 | Hsu et al. | ...................... 438/257 |
| 2005/0054119 A1 * | 3/2005 | Hsu et al. | ............................. 438/3 |
| 2005/0239262 A1 * | 10/2005 | Zhuang et al. | ................ 438/385 |
| 2009/0218565 A1 | 9/2009 | Kawano | |

FOREIGN PATENT DOCUMENTS

JP    2009/218260    9/2009
WO    WO 2005/117021    12/2005

OTHER PUBLICATIONS

PCT Seach Report and Written Opinion dated Oct. 7, 2010.

* cited by examiner

*Primary Examiner* — Matthew Landau
*Assistant Examiner* — Robert Bachner
(74) *Attorney, Agent, or Firm* — Mueting Raasch & Gebhardt PA

(57) ABSTRACT

A resistive sense memory cell includes a layer of crystalline praseodymium calcium manganese oxide and a layer of amorphous praseodymium calcium manganese oxide disposed on the layer of crystalline praseodymium calcium manganese oxide forming a resistive sense memory stack. A first and second electrode are separated by the resistive sense memory stack. The resistive sense memory cell can further include an oxygen diffusion barrier layer separating the layer of crystalline praseodymium calcium manganese oxide from the layer of amorphous praseodymium calcium manganese oxide a layer. Methods include depositing an amorphous praseodymium calcium manganese oxide disposed on the layer of crystalline praseodymium calcium manganese oxide forming a resistive sense memory stack.

16 Claims, 4 Drawing Sheets

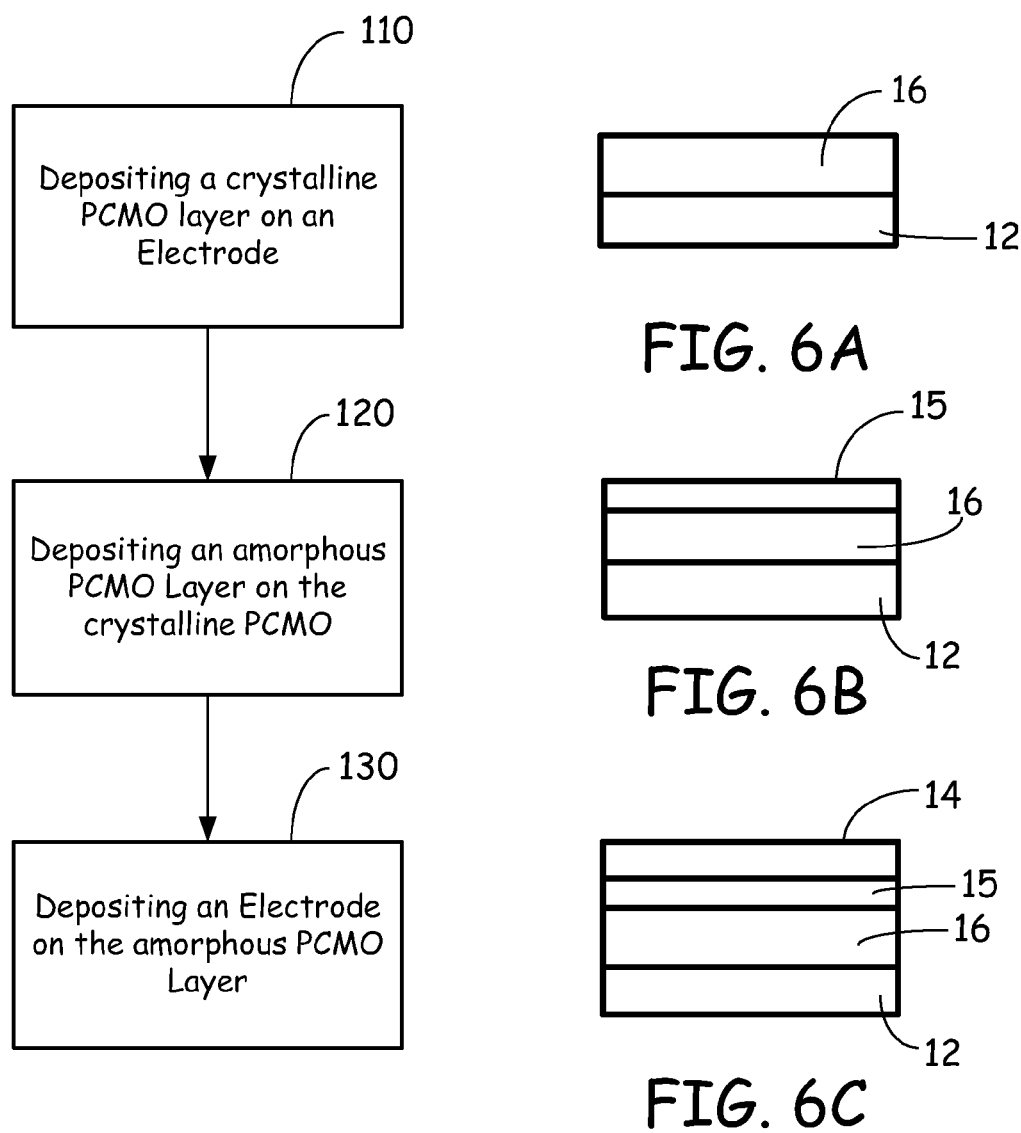

NON-VOLATILE RESISTIVE SENSE MEMORY WITH PRASEODYMIUM CALCIUM MANGANESE OXIDE

BACKGROUND

Fast growth of the pervasive computing and handheld/communication industry has generated exploding demand for high capacity non-volatile solid-state data storage devices. Current technology like flash memory, that utilizes a floating gate from which electrons tunnel, has several drawbacks such as slow access speed, limited endurance, and the integration difficulty. Flash memory (NAND or NOR) also faces significant scaling problems.

Resistive sense memories are promising candidates for future non-volatile and universal memory by storing data bits as either a high or low resistance state. One such memory, resistive RAM (RRAM) has a variable resistance layer that can switch between a high resistance state and a low resistance state (for example by the presence or absence of a conductive filament or interface effect variation) by applicant of a current or voltage.

However, many yield-limiting factors must be overcome before resistive sense memory enters the production stage, including better switching current characteristics.

BRIEF SUMMARY

The present disclosure relates to non-volatile resistive sense memory that includes a dual layer of calcium-doped praseodymium manganite or praseodymium calcium manganese oxide, hereafter referred to as PCMO. In particular the present disclosure relates to resistive memory cells that include a layer of crystalline PCMO and a layer of amorphous PCMO disposed on the layer of crystalline PCMO forming a resistive sense memory stack. In some embodiments the resistive sense memory stack includes an oxygen diffusion barrier layer separating the layer of crystalline PCMO from the layer of amorphous PCMO a layer.

In one illustrative embodiment, a resistive sense memory cell includes a layer of crystalline PCMO and a layer of amorphous PCMO disposed on the layer of crystalline PCMO forming a resistive sense memory stack. A first and second electrode are separated by the resistive sense memory stack. The resistive sense memory cell can further include an oxygen diffusion barrier layer separating the layer of crystalline PCMO from the layer of amorphous PCMO.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which:

FIG. 5 is a flow diagram of an illustrative method of forming a nonvolatile resistive sense memory cell;

FIGS. 6A-6C are schematic cross-section views of a nonvolatile resistive sense memory cell at various stages of manufacture.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1:
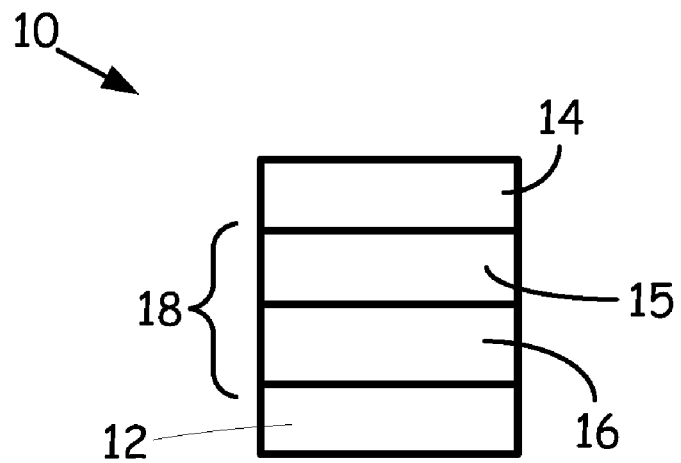
FIG. 1 is a schematic side view diagram of an illustrative nonvolatile resistive sense memory cell.

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

Spatially related terms, including but not limited to, "lower", "upper", "beneath", "below", "above", and "on top", if used herein, are utilized for ease of description to describe spatial relationships of an element(s) to another. Such spatially related terms encompass different orientations of the device in use or operation in addition to the particular orientations depicted in the figures and described herein. For example, if a cell depicted in the figures is turned over or flipped over, portions previously described as below or beneath other elements would then be above those other elements.

As used herein, when an element, component or layer for example is described as being "on" "connected to", "coupled with" or "in contact with" another element, component or layer, it can be directly on, directly connected to, directly coupled with, in direct contact with, or intervening elements, components or layers may be on, connected, coupled or in contact with the particular element, component or layer, for example. When an element, component or layer for example is referred to as begin "directly on", "directly connected to", "directly coupled with", or "directly in contact with" another element, there are no intervening elements, components or layers for example.

The present disclosure relates to non-volatile resistive sense memory that includes a dual layer of calcium-doped praseodymium manganite or praseodymium calcium manganese oxide or PCMO (e.g., $Pr_{1-x}Ca_xMnO_3$). In particular the present disclosure relates to resistive memory cells that include a layer of crystalline PCMO and a layer of amorphous PCMO disposed on the layer of crystalline PCMO forming a resistive sense memory stack. In some embodiments the resistive sense memory stack includes an oxygen diffusion barrier layer separating the layer of crystalline PCMO from the layer of amorphous PCMO. These devices have been shown to switch at lower voltages (on the order or one volt) or currents and provide more symmetric switching characteristics than other single layer PCMO devices. In addition, inclusion of the oxygen diffusion barrier layer has been shown to improve the data state retention of the memory cell. While the present disclosure is not so limited, an appreciation of various aspects of the disclosure will be gained through a discussion of the examples provided below.

FIG. 1 is a schematic side view diagram of an illustrative nonvolatile resistive sense memory cell 10. The resistive sense memory cell 10 includes a layer of crystalline PCMO 16, a layer of amorphous PCMO 15 disposed on the layer of crystalline PCMO 16 forming a resistive sense memory stack 18. A first electrode 12 and a second electrode 14 are separated by the resistive sense memory stack 18.

The term PCMO refers to $Pr_{1-X}Ca_XMnO_3$ (wherein X is in a range from 0.2 to 0.6 in some embodiments). This material deposited between noble metal or oxide electrodes is a promising candidate for resistive sense memory material. This material provides interface effect RRAM as opposed to filament-formation RRAM. Interface effect RRAM materials are complex metal oxides that contain two or more materials and no initial forming is required of these materials, as opposed to filament-formation RRAM. Applying a current through the material in one direction places the material in a high resistance state. Applying a current through the material in an opposing direction places the material in a low resistance state. However, this material appears to suffer from a number of drawbacks. This material requires a relatively high switching voltage, in a range from 3 to 5 volts and secondly, this material appears to possess asymmetric switching where the switching voltage in one direction is 50% larger than the opposing direction switching voltage. In addition, this material appears to exhibit low data state retention duration. The resistive sense memory cell constructions described herein appear to overcome theses deficiencies.

When the PCMO material is deposited at a temperature greater than 400 degrees centigrade, the PCMO material forms a crystal structure. The crystal structure improves the electrical conductivity of the PCMO material. When the PCMO material is deposited at a temperature less than 400 degrees centigrade or less than 375 degrees centigrade or less than 350 degrees centigrade, the PCMO material is amorphous. Amorphous PCMO material is a better electrical insulator than crystalline PCMO material.

The crystalline PCMO material acts as an oxide conductor that additionally functions as the oxygen supply for the amorphous PCMO material. The amorphous PCMO material forms a tunnel barrier there the tunnel barrier height or thickness controlled by the oxygen concentration of the amorphous PCMO material. In many embodiments the amorphous PCMO has a thickness in a range from 1 to 10 nanometers or from 1 to 7 nanometers or from 1 to 5 nanometers and the crystalline PCMO material has a thickness in a range from 10 to 100 nanometers or from 10 to 75 nanometers or from 20 to 50 nanometers. Oxygen ion migration between the PCMO layers allows the memory cell to switch between the high and low resistance data state.

Figure 2:
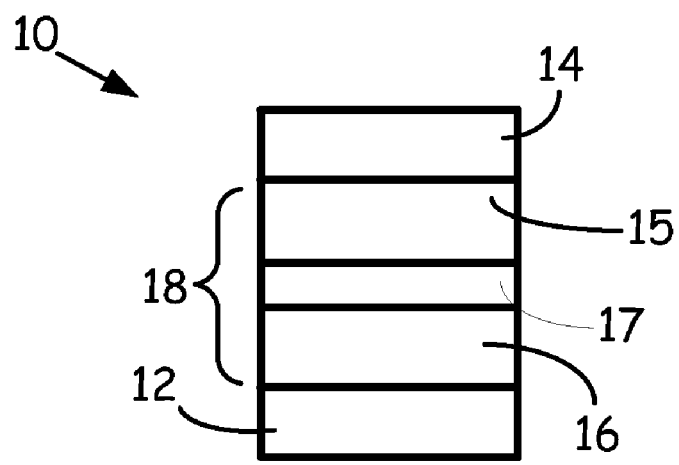
FIG. 2 is a schematic side view diagram of another illustrative nonvolatile resistive sense memory cell.

The electrodes 12, 14 can be formed of any useful inert and conducting material. In many embodiments, the electrodes 12, 14 are formed of a noble metal or an inert metal such as, tungsten (W), nickel (Ni), molybdenum (Mo), platinum (Pt), gold (Au), palladium (Pd), and rhodium (Rh) for example. The first electrode 12 can be, but need not be formed on a substrate. The substrate, if utilized, can include silicon, a mixture of silicon and germanium, and other similar materials. FIG. 1 and FIG. 2 do not depict an optional substrate.

FIG. 2 is a schematic side view diagram of another illustrative nonvolatile resistive sense memory cell 10. The resistive sense memory cell or non-volatile memory cell 10 includes a layer of crystalline PCMO 16, a layer of amorphous PCMO 15, and an oxygen diffusion barrier layer 17 separating the layer of crystalline PCMO 16 from the layer of amorphous PCMO 15, forming a resistive sense memory stack 18. A first electrode 12 and a second electrode 14 are separated by the resistive sense memory stack 18.

The oxygen diffusion barrier layer 17 enhances the thermal stability of the memory cell. The oxygen diffusion barrier layer 17 can be formed of any useful material that allows oxygen ions to move through it in the presence of an electrical bias, but inhibits oxygen or oxygen ion transport through it in the absence of an electrical bias. Examples of useful oxygen diffusion barrier layer 17 materials include metals or conductive oxides. Metallic oxygen diffusion barrier layer material includes platinum, for example. Conductive oxide oxygen diffusion barrier layer material includes IrO, RuO, $SrRuO_3$, lanthanum calcium manganese oxide (i.e., LCMO), and the like, for example. The oxygen diffusion barrier layer 17 can have any useful thickness. In many embodiments, the oxygen diffusion barrier layer 17 has a thickness in a range from 1 to 10 nanometers, or from 2 to 10 nanometers.

When a voltage potential is applied across the resistive sense memory stack 18 in a first direction, oxygen ions are driven from the layer of crystalline PCMO 16 to the layer of amorphous PCMO 15 through the oxygen diffusion barrier layer 17. This process is field driven. The diffusion thorough the oxygen diffusion barrier layer 17 is driven by the concentration gradient of oxygen ions between the adjacent surfaces of the crystalline PCMO 16 and the layer of amorphous PCMO 15. When the voltage is removed the oxygen now in the layer of amorphous PCMO 15 is not driven through the oxygen diffusion barrier layer 17 and no oxygen gradient will be present. This reduces the oxygen diffusion through the oxygen diffusion barrier layer 17 and enhances the memory retention of the nonvolatile resistive sense memory cell 10.

Figure 3:
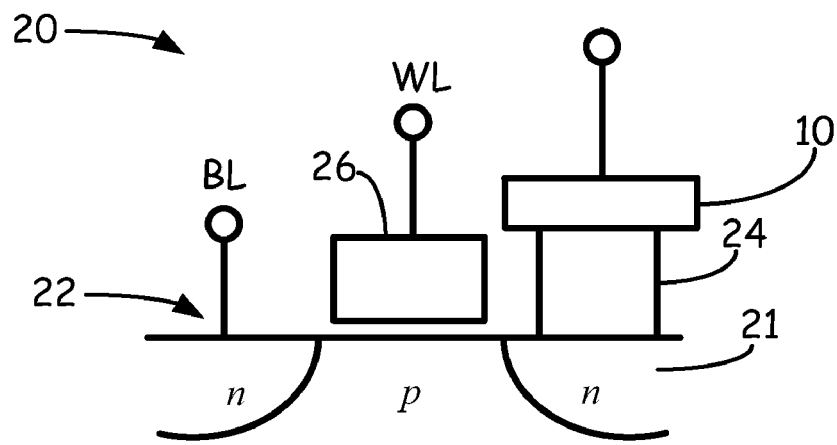
FIG. 3 is a schematic diagram of an illustrative nonvolatile resistive sense memory cell including a semiconductor transistor.

FIG. 3 is a schematic diagram of an illustrative nonvolatile resistive sense memory cell 20 including a semiconductor transistor 22. Memory cell or unit 20 includes a resistive sense memory cell 10, as described herein, electrically coupled to semiconductor transistor 22 via an electrically conducting element 24. Transistor 22 includes a semiconductor substrate 21 having doped regions (e.g., illustrated as n-doped regions) and a channel region (e.g., illustrated as a p-doped channel region) between the doped regions. Transistor 22 includes a gate 26 that is electrically coupled to a word line WL to allow selection and current to flow from a bit line BL to memory cell 10. An array of resistive sense memory units 20 can be formed on a semiconductor substrate utilizing semiconductor fabrication techniques.

Figure 4:
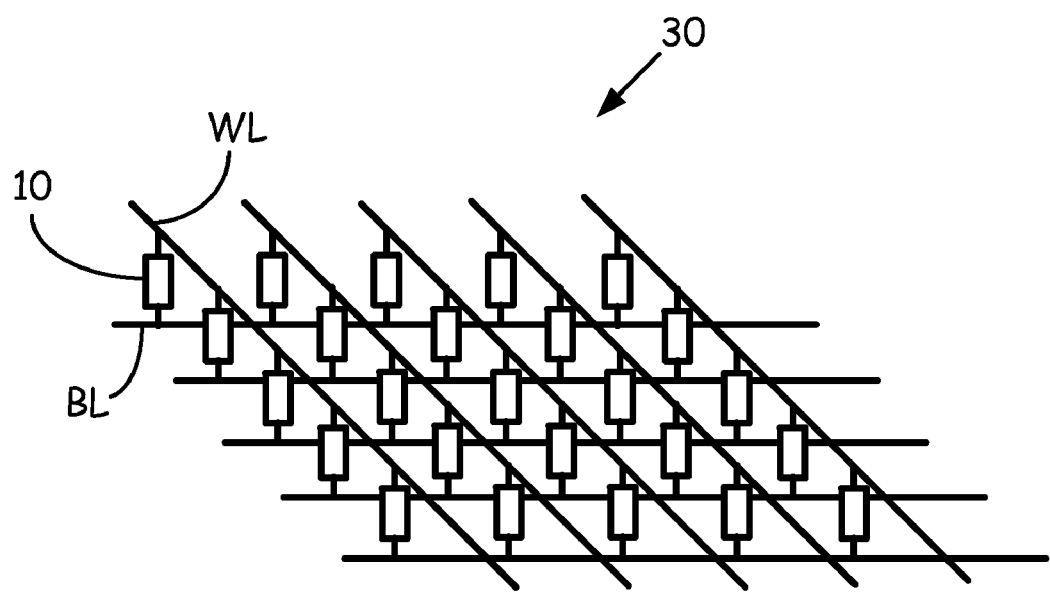
FIG. 4 is a schematic diagram of an illustrative nonvolatile resistive sense memory array.

FIG. 4 is a schematic diagram of an illustrative nonvolatile resistive sense array 30. Memory array 30 includes a plurality of word lines WL and a plurality of bit lines BL forming a cross-point array. At each cross-point a resistive sense memory cell 10, as described herein, is electrically coupled to word line WL and bit line BL. A select device (not shown) can be at each cross-point or at each word line WL and bit line BL.

FIG. 5 is a flow diagram of an illustrative method of forming a nonvolatile resistive sense memory cell. FIGS. 6A-6C are schematic cross-section views of a nonvolatile resistive sense memory cell at various stages of manufacture.

At FIG. 6A a layer of crystalline PCMO 16 is deposited on a first electrode 12 at block 110 of FIG. 5. The layer of crystalline PCMO 16 is deposited at a temperature sufficient to form a crystal structure in the PCMO layer 16. In many embodiments the deposition temperature is greater than 400 degrees centigrade. Both the layer of crystalline PCMO 16 and the first electrode 12 can be formed by physical vapor deposition, chemical vapor deposition, electrochemical deposition, molecular beam epitaxy and atomic layer deposition. While not illustrated, the first electrode 12 can be deposited on a substrate. The substrate includes, but is not limited to silicon, a mixture of silicon and germanium, and other similar material.

At FIG. 6B a layer of amorphous PCMO 15 is deposited on the layer of crystalline PCMO 16 at block 120 of FIG. 5. The layer of amorphous PCMO 15 is deposited at a temperature sufficient to form an amorphous or non-crystalline PCMO layer 15. In many embodiments the deposition temperature is less than 400 degrees centigrade, or less than 375 degrees centigrade, or less than 350 degrees centigrade.

At FIG. 6C a second electrode 14 is deposited on the layer of amorphous PCMO 15 at block 130 of FIG. 5. The second electrode 14 can be formed using the deposition methods described above. Additional metal contact layer(s) can be formed on the second electrode 14.

Figure 7:
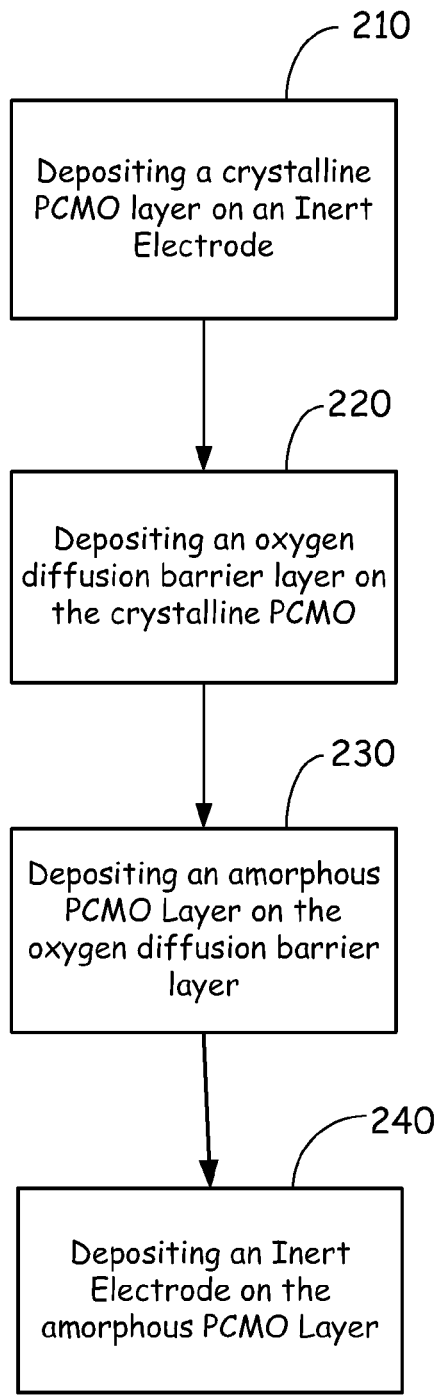
FIG. 7 is a flow diagram of another illustrative method of forming a nonvolatile resistive sense memory cell.

FIG. 7 is a flow diagram of another illustrative method of forming a nonvolatile resistive sense memory cell. FIGS. 8A-8D are schematic cross-section views of another nonvolatile resistive sense memory cell at various stages of manufacture.

Figure 8A:
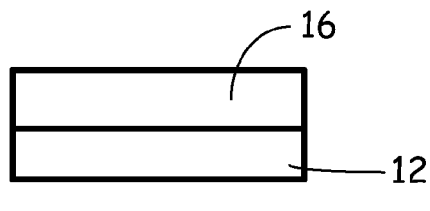
FIGS. 8A-8D are schematic cross-section views of another nonvolatile resistive sense memory cell at various stages of manufacture.

At FIG. 8A a layer of crystalline PCMO 16 is deposited on a first electrode 12 at block 210 of FIG. 7. The layer of crystalline PCMO 16 is deposited at a temperature sufficient to form a crystal structure in the PCMO layer 16, as described above. While not illustrated, the first electrode 12 can be deposited on a substrate. The substrate includes, but is not limited to silicon, a mixture of silicon and germanium, and other similar material.

Figure 8B:
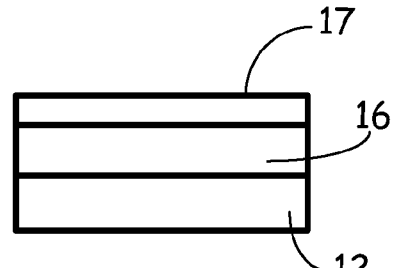

At FIG. 8B an oxygen diffusion barrier layer 17 is deposited on the layer of crystalline PCMO 16 at block 220 of FIG. 7. The oxygen diffusion barrier layer 17 can be formed using the deposition methods described above.

Figure 8C:
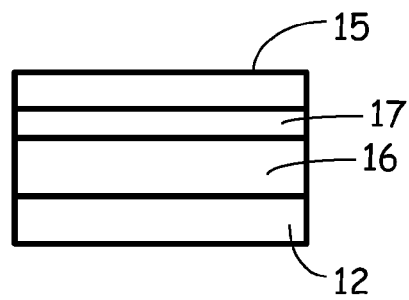

At FIG. 8C a layer of amorphous PCMO 15 is deposited on the oxygen diffusion barrier layer 17 at block 230 of FIG. 7. The layer of amorphous PCMO 15 is deposited at a temperature sufficient to form an amorphous or non-crystalline PCMO layer 15, as described above.

Figure 8D:
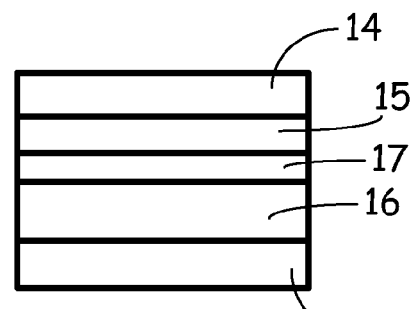

At FIG. 8D a second electrode 14 is deposited on the layer of amorphous PCMO 15 at block 240 of FIG. 7. The second electrode 14 can be formed using deposition methods described above. Additional metal contact layer(s) can be formed on the second electrode 14.

Thus, embodiments of the NON-VOLATILE RESISTIVE SENSE MEMORY WITH IMPROVED SWITCHING are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A resistive sense memory cell comprising:
   a layer of crystalline praseodymium calcium manganese oxide having a thickness in a range from 10 to 75 nanometers;
   a layer of amorphous praseodymium calcium manganese oxide having a thickness in a range from 1 to 7 nanometers disposed on the layer of crystalline praseodymium calcium manganese oxide forming a resistive sense memory stack; and
   a first and second electrode separated by the resistive sense memory stack, and
   an oxygen diffusion barrier layer separating the layer of crystalline praseodymium calcium manganese oxide from the layer of amorphous praseodymium calcium manganese oxide;
   wherein the praseodymium calcium manganese oxide comprises $Pr_{1-X}Ca_XMnO_3$, wherein X is in a range from 0.2 to 0.6.

2. A resistive sense memory cell according to claim 1 wherein the first and second electrodes are formed of noble metals.

3. A resistive sense memory cell according to claim 1 wherein the oxygen diffusion barrier layer is a metallic oxygen diffusion barrier layer.

4. A resistive sense memory cell according to claim 3 wherein the oxygen diffusion barrier layer has a thickness in a range from 1 to 10 nanometers.

5. A resistive sense memory cell according to claim 3 wherein the oxygen diffusion barrier layer is a platinum layer.

6. A resistive sense memory cell according to claim 1 wherein the oxygen diffusion barrier layer is a conductive oxide oxygen diffusion barrier layer.

7. A non-volatile memory cell comprising:
   a layer of crystalline praseodymium calcium manganese oxide;
   a layer of amorphous praseodymium calcium manganese oxide;
   an oxygen diffusion barrier layer separating the crystalline praseodymium calcium manganese oxide layer from the amorphous praseodymium calcium manganese oxide layer, forming a resistive sense memory stack, wherein the oxygen diffusion barrier layer allows oxygen ions to move through it with an electrical bias, but inhibits oxygen or oxygen ion transport through it in absence of an electrical bias; and
   a first and second electrode separated by the resistive sense memory stack.

8. A non-volatile memory cell according to claim 7 wherein the layer of crystalline praseodymium calcium manganese oxide has a thickness in a range from 10 to 75 nanometers and the layer of amorphous praseodymium calcium manganese oxide has a thickness in a range from 1 to 7 nanometers.

9. A non-volatile memory cell according to claim 8 wherein the oxygen diffusion barrier layer has a thickness in a range from 1 to 10 nanometers.

10. A non-volatile memory cell according to claim 7 wherein the first and second electrodes are formed of tungsten, nickel, molybdenum, platinum, gold, palladium, rhodium, and alloys, mixtures or combinations thereof.

11. A non-volatile memory cell according to claim 7 wherein the oxygen diffusion barrier layer is a metallic oxygen diffusion barrier layer comprising platinum.

12. A non-volatile memory cell according to claim 7 wherein the praseodymium calcium manganese oxide comprises $Pr_{1-X}Ca_XMnO_3$, wherein X is in a range from 0.2 to 0.6.

13. A non-volatile memory cell according to claim 7 wherein the oxygen diffusion barrier layer is a conductive oxide oxygen diffusion barrier layer comprising IrO, RuO, SrRuO$_3$, lanthanum calcium manganese oxide, or combinations thereof.

14. A method comprising:
  depositing a layer of crystalline praseodymium calcium manganese oxide on a first electrode;
  depositing an oxygen diffusion barrier layer on the layer of crystalline praseodymium calcium manganese oxide;
  depositing a layer of amorphous praseodymium calcium manganese oxide on the oxygen diffusion barrier; and
  depositing a second electrode on the layer of amorphous praseodymium calcium manganese oxide, forming a resistive sense memory cell.

15. A method according to claim 14 wherein the crystalline praseodymium calcium manganese oxide is deposited at a temperature of at least 400 degrees centigrade.

16. A method according to claim 14 wherein the amorphous praseodymium calcium manganese oxide is deposited at a temperature of less than 400 degrees centigrade.

* * * * *